United States Patent [19]
Madden

[11] Patent Number: 5,568,364
[45] Date of Patent: Oct. 22, 1996

[54] SONICALLY-BONDED OUTER SUPPORT STRUCTURE FOR AN INTEGRATED CIRCUIT CARD

[75] Inventor: Henry R. Madden, Modesto, Calif.

[73] Assignee: Wireless Access Inc., Santa Clara, Calif.

[21] Appl. No.: 352,384

[22] Filed: Dec. 8, 1994

Related U.S. Application Data

[63] Continuation-in-part of Ser. No. 114,656, Aug. 31, 1993, abandoned.

[51] Int. Cl.$^6$ .................................................. H05K 5/00
[52] U.S. Cl. .................... 361/752; 361/796; 174/17 R
[58] Field of Search .................... 361/752, 796, 361/754, 815; 174/17 R; 220/359, 612, 613, 691, 354; 156/73.1, 87, 293; 264/23

[56] References Cited

U.S. PATENT DOCUMENTS

| | | |
|---|---|---|
| 3,952,937 | 4/1976 | Lamons et al. . |
| 3,998,505 | 12/1976 | Frost et al. . |
| 4,011,961 | 3/1977 | Widen et al. . |
| 4,410,383 | 10/1983 | Lipari . |
| 4,739,345 | 4/1988 | Namba et al. . |
| 4,750,075 | 6/1988 | Oishi . |
| 4,970,610 | 11/1990 | Knappe . |
| 4,970,618 | 11/1990 | Kato et al. . |
| 5,163,327 | 11/1992 | Papai . |
| 5,199,593 | 4/1993 | Kita . |
| 5,288,350 | 2/1994 | Kita .......................................... 156/73.1 |

OTHER PUBLICATIONS

IBM Technical Disclosure Bulletin, "Ultrasonically Welded Diskette Cartridge", L. Rose, W. H. Schaefer, M. G. Sloan, R. C. Walsh, vol. 26, No. 9, Feb. 1984, pp. 4656–4657.

Primary Examiner—Leo P. Picard
Assistant Examiner—Y. Whang
Attorney, Agent, or Firm—Blakely, Sokoloff, Taylor & Zafman

[57] ABSTRACT

A integrated circuit card having a rigidized frame to surround the electronic devices on a printed circuit (PC) board. The card includes a frame and integral cover for the top and bottom. The top and bottom are constructed out of a material that does not interfere with the use of an antenna coupled to the board assembly within the card. The bottom and top are coupled together using pins. When the two are coupled together the frame is better supported.

24 Claims, 4 Drawing Sheets

CENTRAL POINT ENERGY DIRECTOR DESIGN
(STRATIGICALLY LOCATED)

BEFORE ULTRASONIC WELDING

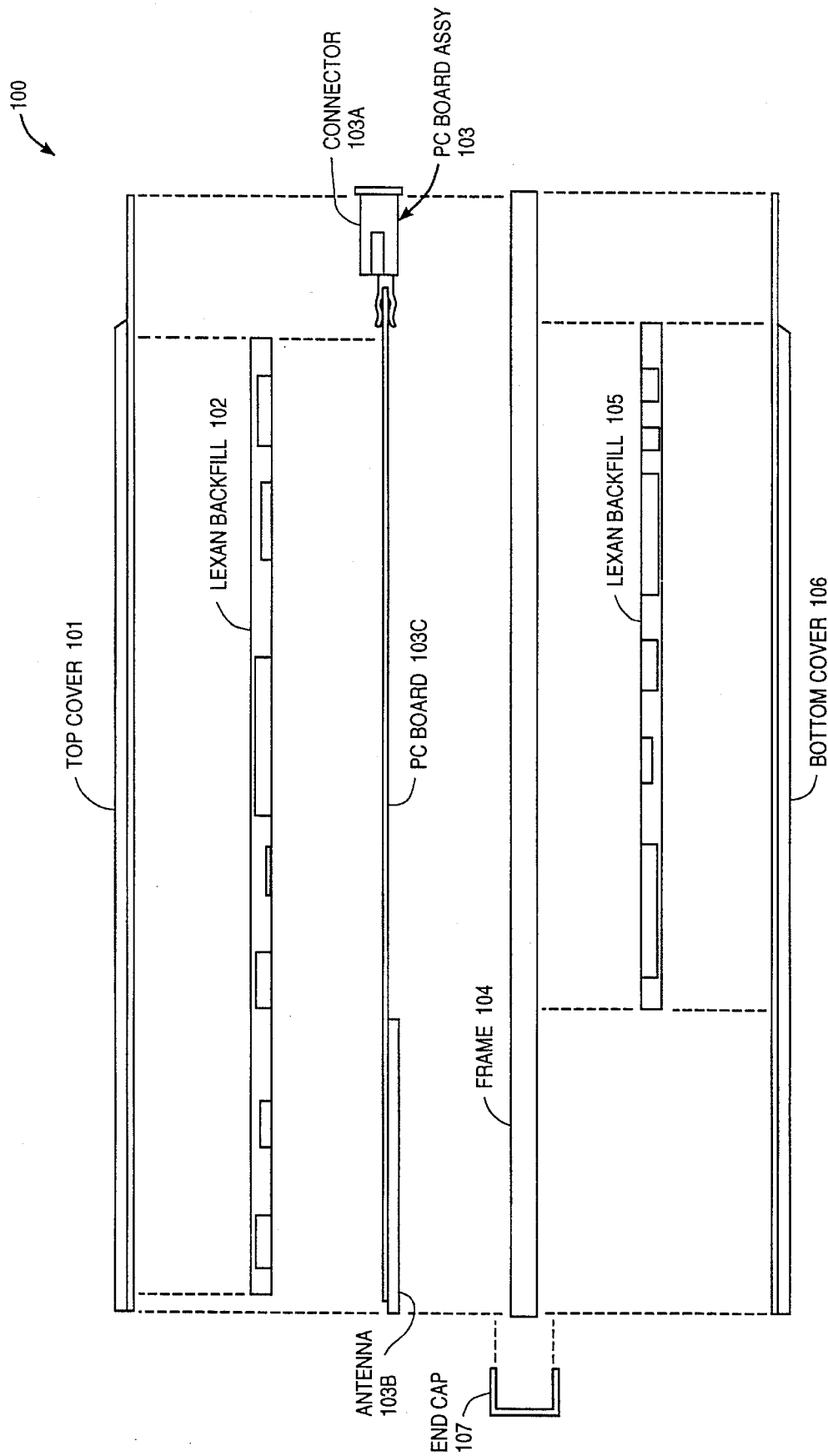
FIG_1

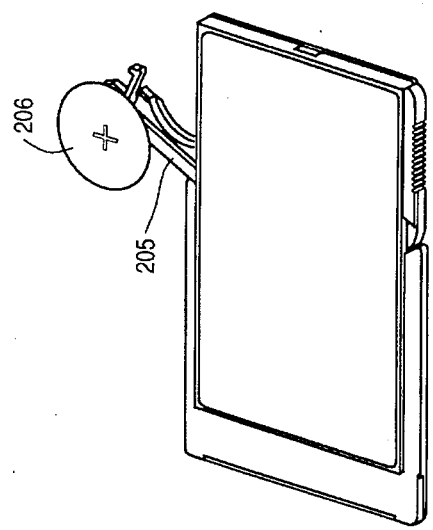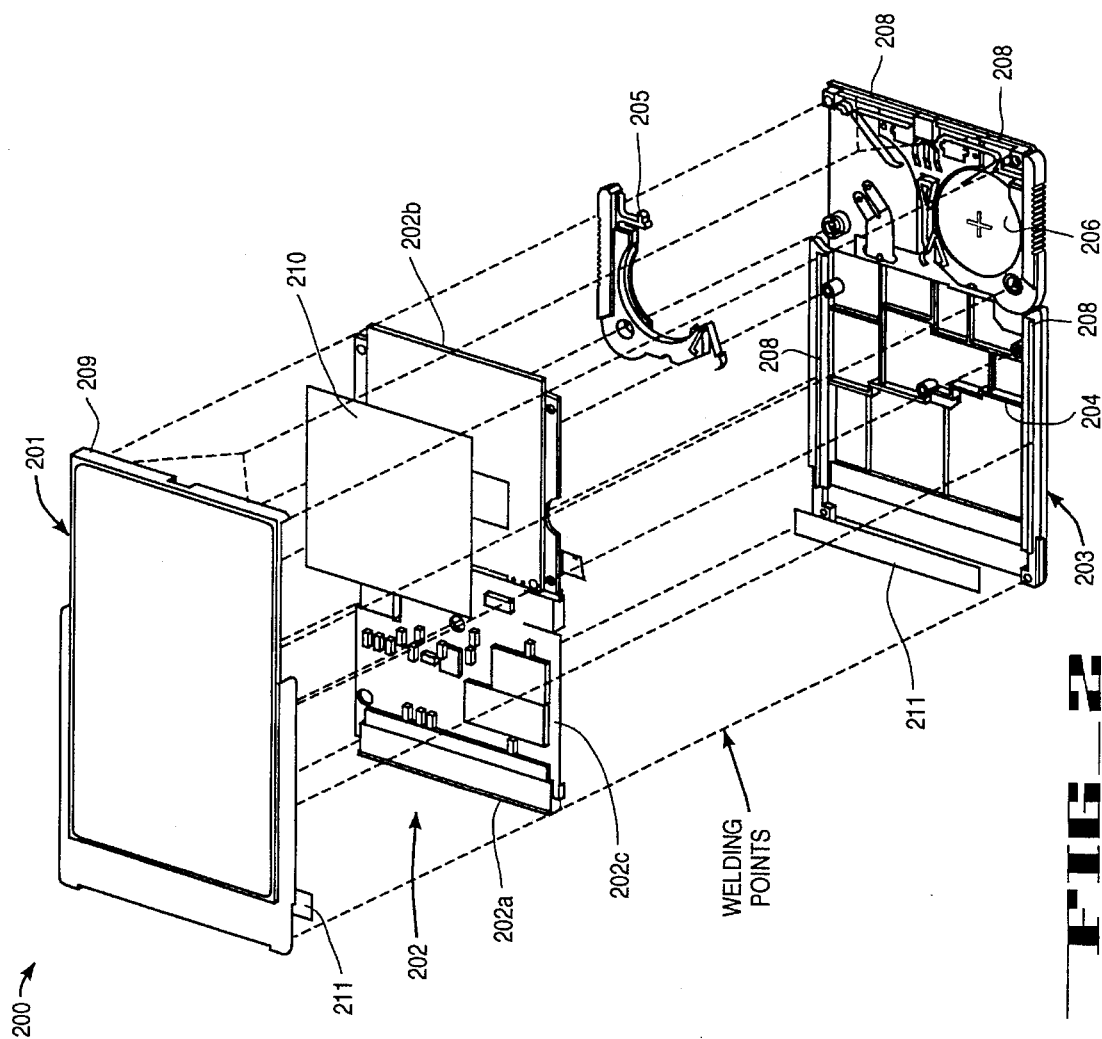

CENTRAL POINT ENERGY DIRECTOR DESIGN
(STRATIGICALLY LOCATED)
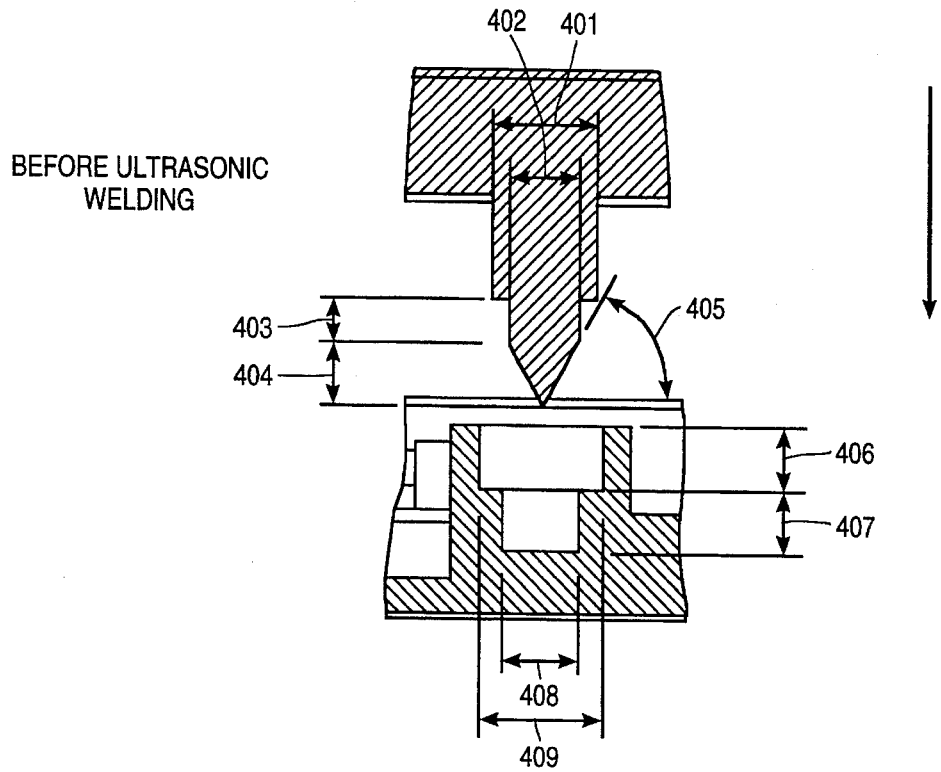
FIG_4A
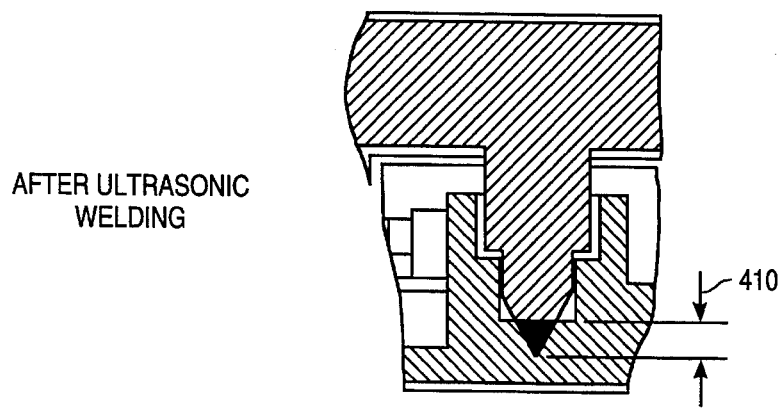
FIG_4B PERIMETER ENERGY DIRECTOR DESIGN
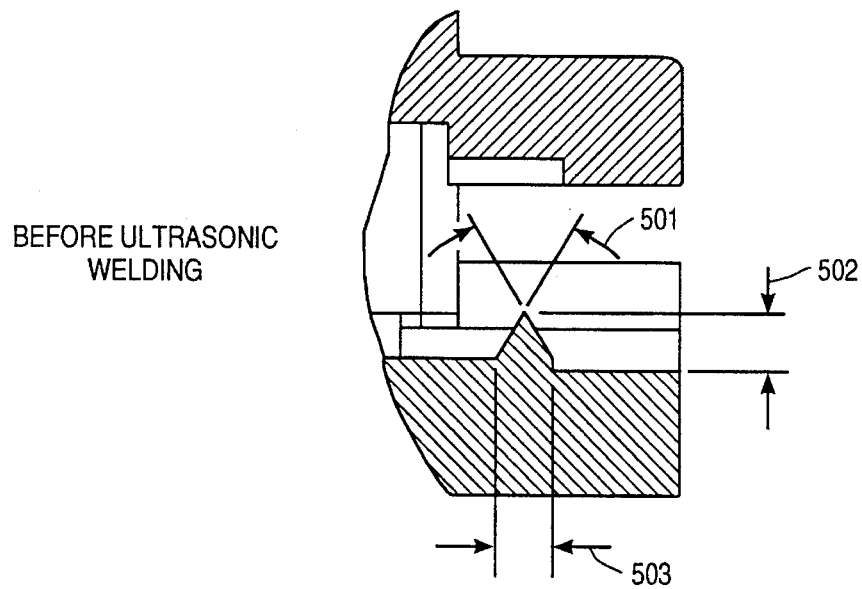
FIG_5A
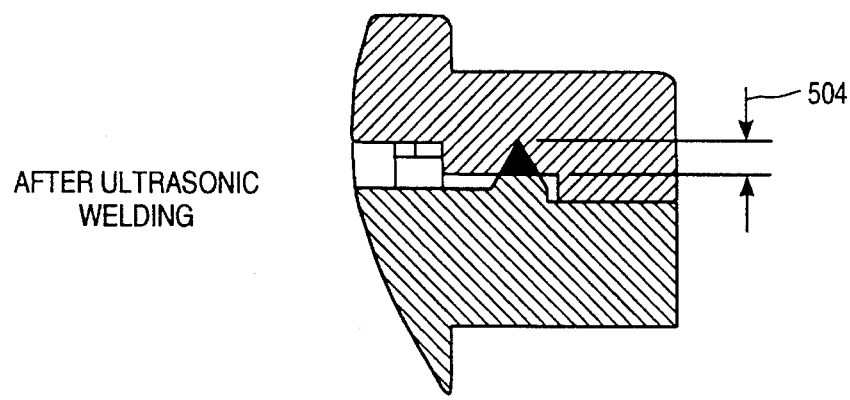
FIG_5B

SONICALLY-BONDED OUTER SUPPORT STRUCTURE FOR AN INTEGRATED CIRCUIT CARD

This is a continuation-in-part of U.S. patent application Ser. No. 08/114,656, entitled "A RIGIDIZED OUTER SUPPORT STRUCTURE FOR AN INTEGRATED CIRCUIT CARD" filed Aug. 31, 1993, and assigned to the corporate assignee of the patent application.

FIELD OF THE INVENTION

The present invention relates to the field of integrated circuit cards; particularly, the present invention relates to a frame for credit-card sized integrated circuit cards having at least two pieces bonded together using sound, such as ultrasound.

BACKGROUND OF THE INVENTION

Today, one of the most rapidly growing markets for computer systems is the portable computer market. Recently, portable computers have become more powerful, while also becoming smaller and lighter. Furthermore, as a part of this changing market, various computer components have become smaller and lighter while their ability to handle more data has increased.

One group of devices which is especially important to portable computers is peripheral input/output devices such as paging receivers, modems, facsimile machines, or local area networks (LANs). A paging receiver, for example, allows a user of a portable computer to receive messages that are broadcast over wide areas. The paging receiver receives paging messages through an antenna and generally stores the paging messages on board for retrieval through the computer system. The reduction in size of paging receivers occurred at the same time as the reduction in size of other components, such as hard disks.

Typically, electronics for computer, such as that of the paging receiver, are arranged on an internal board within the computer. Some arrangements provide separate portable electronics which will be carried along and attached to a portable computer when needed. Furthermore, some electronics, paging receivers in particular, have been designed recently to plug into sockets recessed within the body of a portable computer. Various forms of computer components may be plugged into the same socket of a computer, thereby reducing the space required within the portable computer. For example, an international standard which defines the physical and electrical interface specifications for the interchangeability of memory and input/output cards was introduced by Personal Computer Memory Card Internationally Association (PCMCIA) concurrently with the Japanese Electrical Industry Association (JEIDA)in September of 1991. These cards are often referred to as integrated circuit (IC) cards.

The PCMCIA specification provides its personal computer cards be a specific size (with respect to its outer dimensions) and to include a 68-pin connector located at the end of the card for the sending and receiving of signals between the card and the computer system.

A side-section view of the standard assembly for a PCMCIA card is shown in FIG. 1. Referring to FIG. 1, PCMCIA card 100 is shown with top cover 101, backfill 102, printed circuit (PC) board assembly 103, frame 104, backfill 105, bottom cover 106 and end cap 107. Top cover 101, bottom cover 106 and frame 104 provide the outer protective structure of PCMCIA card 100. Top cover 101, bottom cover 106 and frame 104 act to protect the components on PC board assembly 103. Frame 104 supports PC board assembly 103 while top cover 101 and bottom cover 106 enclose the remainder of card 100. Top cover 101 and bottom cover 106 are typically comprised of metal, such as stainless steel.

PC board assembly 103 contains the electronic and integrated circuit components used to provide the functionality of PCMCIA card 100. For instance, the components on PC board assembly 103 may allow PCMCIA card 100 to act as a paging receiver, a modem, a LAN access or one or more of a variety of other functions. In one embodiment, PC board assembly 103 includes a mating connector 103A for interfacing with the computer system (e.g., notebook or laptop computer system). PC board assembly 103 also includes PC board 103C which couples the electronic components in board assembly 103 together. If PC board assembly 103 is to act as a paging receiver, an antenna 103B may also be coupled to PC board 103C to receive paging messages. End cap 107 holds the entire structure together by sliding over the ends of top cover 101 and bottom cover 103 when they are in contact with frame 104.

One problem with using end cap 107 is that it adds to the overall height of PCMCIA card 100. In other embodiments, pins may be used to hold the entire structure together. The integrity of such a coupling is good, its reliability is more suspect due to its mechanical nature. Thus, it is desirable to provide a reliable mechanical coupling for the PCMCIA cards.

Another problem with prior art PCMCIA card assemblies is that they did not adequately protect the circuit components on PC board assembly 103. Because the size (i.e., thickness) requirements of the card and the size of the circuit components, the metal used for top cover 101 and bottom cover 106 is usually thin. Since the metal is thin, it is easy to depress top cover 101 and bottom cover 106 into the card and damage the circuit components when handling the card. One prior art solution to this problem was to provide backfill 102 and backfill 105 to the standard assembly of PCMCIA card 100, as shown in FIG. 1. Backfills 102 and 103 are typically lexan plastic sections designed to provide added support and protection to the components on PC board assembly 103 by preventing top cover 101 and bottom cover 106 from being depressed into the card interior. One problem of using backfill 102 and backfill 105 is that the plastic must be molded to the specific configuration of the components on PC board assembly 103. Therefore, if changes are made to the components on PC board assembly 103, backfill 102 and backfill 105 may have to be redesigned. The redesign may require producing another mold by which the plastic backfills 102 and 105 are made. It is desirable to produce the PCMCIA card which protects the circuit components on the PC board assembly 103 without having to use backfill sections.

One possible solution to strengthening the outer structure is to utilize a thicker metal structure for top cover 101, bottom cover 106 and frame 104. On one hand, the thickness of the metal is limited by the requirement of the PCMCIA standard that the cards be of a certain thickness. Furthermore, in certain applications, PCMCIA card 100 cannot utilize a metal outer structure. For instance, if PCMCIA card 100 is designed to be a paging receiver, an antenna is required for receiving paging messages. This antenna would be located within PCMCIA card 100. A metal outer structure would interfere with the antenna's ability to receive the paging messages. Therefore, a metal outer structure cannot be used for all applications of PCMCIA cards. Therefore, it is desirable to strengthen the outer structure without having to use a metal or conductive outer structure.

Ultrasonic welding, or bonding, has been used in the prior art to connect, for instance, two halves of a magnetic recording diskette jacket. However, some PC board components, such as certain integrated circuits and crystal oscillators, become damaged during exposure to ultrasound. Therefore, it is desirable to avoid damaging PC board components when using ultrasonic welding.

The present invention provides an assembly configuration for a PCMCIA card. The present invention provides an outer support that protects the components on the PC board assembly while not requiring backfill components in the assembly. Furthermore, the present invention provides for coupling the integrated circuit card components in a more secure and reliable manner. Moreover, the present invention provides an outer support structure for a PCMCIA card that does not interfere with an on-board antenna.

SUMMARY OF THE INVENTION

An integrated circuit (IC) card for use in a computer system is described. The IC card of the present invention includes a top cover integrated with a portion of a frame and a bottom cover integrated with another portion of the frame. The top cover/frame and bottom cover/frame contain welding points at which point a sonic bond, or weld, between the top and bottom covers is made. The IC card includes a board assembly that contains electronic devices that operate together to provide a specific function, such as that of a paging receiver, modem, LAN, etc. The board assembly includes an interface for coupling the PC board to the computer system so that signals may be transferred signals between the computer system and the electronic devices on the board assembly. The top cover/frame and the bottom cover/frame are bonded together such that a single frame is formed: around the board assembly and the board assembly is contained within the frame and two covers with the coupling mechanism exposed outside of the IC card.

BRIEF DESCRIPTION OF THE DRAWINGS

The present invention will be understood more fully from the detailed description given below and from the accompanying drawings of the preferred embodiments of the invention, which, however, should not be taken to limit the invention to the specific embodiments, but are for explanation and understanding only.

FIG. 1 illustrates a side-section view of a prior art assembly for a PCMCIA integrated circuit card.

FIG. 2 illustrates a perspective view of the various components of one embodiment of the integrated circuit card assembly of the present invention.

FIG. 3 illustrates a perspective view of one embodiment of an integrated circuit card of the present invention.

FIGS. 4A and 4B illustrate an embodiment of a central point energy director and receptor before and after bonding.

FIGS. 5A and 5B illustrate an embodiment of a perimeter energy director before and after bonding.

DETAILED DESCRIPTION OF THE PRESENT INVENTION

A credit-card sized integrated circuit card is described. In the following detailed description of the present invention numerous specific details are set forth, such as specific dimensions, numbers of energy directors and receptors, number of bonding points, etc., in order to provide a thorough understanding of the present invention. However, it will be apparent to one skilled in the art that the present invention may be practiced without these specific details. In other instances, well-known structures and devices are shown in block diagram form, rather than in detail, in order to avoid obscuring the present invention.

Overview of the Present Invention

The present invention provides a card architecture for a credit-card sized integrated circuit (IC) card. In one embodiment, the integrated circuit card assembly is for a PCMCIA card. The present invention may be used for other types of integrated circuit cards that may be inserted in a slot in the side of the computer system for its use.

FIGS. 2 and 3 illustrate the integrated circuit card assembly of the present invention using perspective views. The IC card architecture shown in FIGS. 2 and 3 adhere to the PCMCIA standard. However, the card architecture of the present invention is not limited to being a PCMCIA card and may be applied to other types of card architecture standards, or even non-standards.

FIG. 2 depicts a perspective view of the integrated circuit card assembly of the present invention. Referring to FIG. 2, assembly 200 comprises a top 201, PC board assembly 202 and bottom 203. Each of top 201 and bottom 203 is integrated with a portion of the frame, such that a single frame is formed when top 201 and bottom 203 are coupled together. The actual percentage of the frame that is integrated into each of top 201 and bottom 203 is variable. That is, each may half of the frame in one embodiment, while in another embodiment, the percentage of the frame integrated into each is not the same. For instance, top 201 may include three-quarters of the frame while bottom 203 only includes one-quarter of the frame. In another embodiment, top 201 may include one-third of the frame while bottom 203 includes two-thirds of the frame. The only limitation is that in one embodiment, the combination of top 201 and bottom 203 provides the entire frame. It should be noted that for the purposes of the present invention, a portion of the frame that is not integrated into top 201 and bottom 203 may be included, such that a single frame is created when bonded with those portions of the frame integrated into top 201 and bottom 203.

Top 201 and bottom 203 form the outer support structure for assembly 200. In one embodiment, top 201 and bottom 203 are comprised of a hard molded plastic material (e.g., a high mold flow plastic with "milled" glass fiber), such as glass filled polycarbonate or other glass-filled plastic material. In one embodiment, the material comprises a polycarbonate named SP7602 and manufactured by General Electric, in Kotemba, Japan. The glass filled polycarbonate structure may be 20% glass. The material may be Riton. Top 201 and bottom 203 may be produced by thermal extrusion (injection molding), injection compression, or any other plastic molding process. The materials used for top 201 and bottom 203 allow top 201 and bottom 203 to be very thin. In one embodiment, the plastic walls of the present invention are as thin as 0.009" having insignificant or no imperfections.

Top 201 and bottom 203 may include inner wall supports (e.g., ribs), such as inner wall supports 204 shown and integrated into bottom 203. Inner wall supports 204 may be located in both top 201 and bottom 203 and protrude from the inner portion of top 201 and bottom 203, such that they surround the electronic and integrated circuit components on PC board assembly 202 when the card is assembled. In this manner, inner wall supports 204 provide additional support, or structural integrity, for assembly 200, such that depression of top 201 and bottom 203 into the interior of the card cannot occur. In this manner, the electronic components and integrated circuits on PC board assembly 202 are protected from damage due to pressure on the outer support structure of the card.

Inner wall supports 204 may be of a variety of sizes and shapes. Inner wall supports 204 may include walls which run across the length of the card, across the width of the card, or from one side of top 201 and bottom 203 to the other. In anther embodiment, inner wall supports 204 may Inner wall supports 204 are a part of top 201 and bottom 203 in that they are integrated and molded into the material for top 201 and bottom 203 respectively. In one embodiment, inner wall supports 204 are molded in the same piece as top 201 and/or bottom 203. In one embodiment, inner wall supports 204 are only integrated into bottom 203.

PC board assembly 202 includes connector 202A, antenna 202B, and PC board 202C. Connector 202A is a pin receptive mating connector. In one embodiment, connector 202A is a 68 pin connector adhering to the PCMCIA standard. Connector 202A may also be an interface other than that of the PCMCIA standard responsible for providing a path for signals propagating between PC board assembly 202 and the remainder of the computer system. One end of each top 201 and bottom 203 are designed such that connector 202A is exposed when assembly 200 is assembled.

PC board 202C contains the integrated circuit and electronic components and devices for the IC card. Such devices and components may include crystal oscillators and SAW filters. In one embodiment, the IC card is a paging radio receiver. In this case, PC board assembly 202 includes electronic devices and components and integrated circuit components having the functionality to receive paging messages and notify a user that such a message has been received. The process of placing the integrated circuits on PC board 202C, as well as the manner in which the included components interact with each other, is well-known in the art.

Antenna 202B provides for reception of paging messages. Antenna 202B is not required if the card does not have to receive data (e.g., messages) via wireless transmission.

Double-sided tape 211 is included to keep connector 202A flush to housing 201 and 203, as well as to add strength to the overall assembly. Double-sided tape 210 is also included to hold antenna 202B to top 201.

Assembly 200 may also include one or more battery holder/ejection mechanisms, such as member 205. Member 205 is rotatably coupled between top 201 and bottom 203 to allow insertion and extraction of a battery that is used to provide power to the components and circuit elements of PC board 202C. Note that a battery holder/ejection mechanism is not required for the PC card of the present invention and, thus, the details of its operation have not been included to avoid obscuring the present invention.

In the present invention, assembly 200 is coupled together using ultrasonic bonding. To facilitate the ultrasonic bonding, top 201 and bottom 203 include a number of welding points. In FIG. 2, the welding points are shown using dotted lines which indicate locations on top 201 and bottom 203 that are welded together during the ultrasonic bonding process. In one embodiment, the welding points are of two types. One of the types of welding points comprises an energy director, or pin extruding from either top 201 or bottom 203 and a corresponding energy receptor, or mating hole, on bottom 203 or top 201 respectively. Another type of welding point may include flat edges running along sides of top 201 and bottom 203, and may include an entire seam. For instance, bottom 203 is shown having multiple receptor holes 207 that receive corresponding energy directors (e.g., pins) integrated into top 201. Also, bottom 203 illustrates edges 208 at which ultrasonic bonding is performed to seal assembly 200.

The number and size of welding points on each of top 201 and bottom 203, as well as their location, may vary. The number of holes and their arrangement is dependent in one embodiment on the requirements on how securely fastened assembly 200 is to be. In one embodiment, all of the energy directors are integrated into top 201, while all of the energy receptors are integrated into bottom 203. In another embodiment, both top 201 and bottom 203 may have integrated energy directors and energy receptors. The energy receptors and directors do not have to be integrated into top 201 and bottom 203, and instead are later fasten by another means (e.g., epoxy) to top 201 and bottom 203. In such a case, however, the strength of the coupling between top 201 and bottom 203 is not as strong as if the receptors and directors are integrated.

Note also that top 201 includes a lip portion 209 which is ultrasonically bonded to an edge 208 on bottom 203. The seam weld is generally stronger than point welds.

It should be noted that PC board assembly 202 may include alignment holes and is a wider PC board than that of the prior art. The alignment holes allow PC board assembly 202 to be positioned between top 201 and bottom 203. In other embodiments, PC board assembly 202 does not include holes and is not as wide as top 201 and bottom 202. It should be noted that although PC board assembly 202 is wide, where assembly 202 is connected, PC board assembly 202 is not exposed, except for connector 202A. In this case, PC board 202A is confined within the IC card. In another embodiment, PC board 202A may be wide enough to form part of the outer frame of the IC card when assembly 200 is coupled together.

FIG. 3 is a perspective view of assembly 200 assembled and bonded together. Note that member 205 has been shown in its open position to allow a battery 206 to be received therefore or thereto.

The ultrasonic bonding process of the present invention begins by aligning the welding points. That is, the energy directors are aligned with their corresponding energy receptors and the seams to be welded are aligned. Then, once aligned, the top and bottom are brought together such that contact is made between their integrated frame portions. After the top and bottom are mated to each other, an ultrasonic welding instrument, such as the CNC Ultrasonic Welding Machine, manufactured by Herrman Ultrasound of Chicago, Ill., is used to ultrasonically bond the top and bottom together. Specifically, the ultrasound machine directs ultrasound waves at each energy director and each seam that is to receive welding. In response, vibrations are caused, resulting eventually in the plastic being melted. The melting that results forms the bond between the surfaces involved. Note that the amplitudes of the ultrasound waves used are selected and tuned so as not to cause the inner walls to explode. For example, when the top and bottom of the assembly are approximately 0.009" thick, the following perimeters for the ultrasonic bonding process are used:

| | |
|---|---|
| Weld time | 0.40 secs |
| Hold time | 1.0 secs |
| Trigger force | 401 bf (lbs) |
| Weld force | 1101 bf (lbs) |

-continued

| | |
|---|---|
| Min. depth | 0.49 mm |
| Max. depth | 0.56 mm |
| Amptitude | 80% of max force |

Note that the parameter settings correspond to the CNC Ultrasonic Welding Machine. After applying the ultrasound to the assembly, the bonded assembly is removed and the bonding process complete. The ultrasound parameters selected and the thickness and strategic location of the energy directors contribute to avoid damage to components, such as crystals and SAW filters, that may be on the PC board within the card architecture.

FIGS. 4A and 4B depict one embodiment of a central point energy director (strategically located) prior to ultrasonic welding and after ultrasonic welding respectively. The dimensions for one embodiment of the energy director are listed in Table 1. Note that the welded area is shown as the shaded triangle.

TABLE 1

| | |
|---|---|
| 401 | Ø0.060 |
| 402 | Ø0.040 |
| 403 | 0.011 |
| 404 | 0.035 |
| 405 | 60.0° |
| 406 | 0.022 |
| 407 | 0.0280 |
| 408 | Ø0.045 |
| 409 | Ø0.070 |
| 410 | 0.020 |

FIGS. 5A and 5B illustrate one embodiment for an energy director for the perimeter of the card prior to and after ultrasonic welding respectively. The dimensions for one embodiment of the energy director, as well as the resulting weld area (shaded triangle in FIG. 5B) are shown in Table 2.

TABLE 2

| | |
|---|---|
| 501 | 60.0° |
| 502 | 0.031 |
| 503 | 0.030 |
| 504 | 0.018 |

Thus, the present invention provides two framing pieces (top 201, bottom 203) having integral covers. Because the frame and cover are integrated together, the outer structure provides greater support and protection to the PC board components. When the top and bottom sections are bonded together by ultrasonic bonding, the overall structure of the IC card is even stronger and more rigid those IC cards in the prior art. Therefore, the present invention provides an IC card that has an improved outer frame structure.

The present invention is also advantages in its use of a non-conductive material for the outer structure. By using a molded plastic, such as glass filled polycarbonate, the outer structure of the IC card does not interfere with interior components, such as an antenna. It should be noted that in some embodiments, the side opposite to the antenna may be metal.

The outer structure of the IC card in the present invention is also less expensive than that of the prior art. Because the frame and cover are produced using a single mold, the IC card assembly is less expensive than stamping out a separate stainless steel cover and molding a lexan backfill section. Thus, the present invention provides for a less expensive IC card assembly.

Whereas many alterations and modifications of the present invention will no doubt become apparent to a person of ordinary skill in the art after having read the foregoing description, it is to be understood that the particular embodiment shown and described by way of illustration is in no way intended to be considered limiting. Therefore, references to details of the preferred embodiment are not intended to limit the scope of the claims which in themselves recite only those features regarded as essential to the invention.

Thus, an outer IC card architecture has been described.

I claim:

1. A card architecture comprising:

a board assembly having a plurality of electronic devices, wherein the board assembly includes an interface to transfer signals to and from plurality of electronic devices;

a first rigid cover having a first integrated portion of a frame and at least one energy director having a width; and a second rigid cover having a second integrated portion of the frame and at least one mating hole to receive said at least one energy director, wherein the mating hole has a width slightly greater than that of said at least one energy director, such that a rigidized frame forms around the board assembly when the first rigid cover and the second rigid cover are sonically bonded together.

2. The card defined in claim 1 wherein the first rigid cover and the second rigid cover are comprised of molded plastic.

3. The card defined in claim 1 wherein the first rigid cover includes a seam ultrasonically bonded to a second seam integrated into the second rigid cover.

4. A PCMCIA card architecture comprising:

a PCMCIA board assembly having a plurality of electronic devices coupled together to provide a function a PCMCIA interface to transfer signals to and from the plurality of electronic devices;

a first rigid PCMCIA cover having a first integrated frame portion, wherein the first rigid cover includes a first plurality of welding points that include at least one energy director that protrudes from the first rigid cover and has a width and a pointed region; and a second rigid PCMCIA cover having a second integrated second portion, wherein the second rigid cover includes a second plurality of welding points that includes and at least one mating hole to receive said at least one energy director, wherein the mating hole has a bottom and a width slightly greater than that of said at least one energy director, wherein the first plurality of welding points of the first rigid cover are ultrasonically-bonded to the second plurality of welding points of the second rigid cover such that the pointed region bonds into and with the bottom of the mating hole to form a rigidized frame around the PCMCIA board assembly that adheres to the PCMCIA standard, and wherein the PCMCIA board assembly is contained within the first rigid PCMCIA cover and the second rigid PCMCIA cover, such that the interface of the PCMCIA board assembly is exposed outside of the PCMCIA card architecture, and further wherein the second rigid PCMCIA cover includes at least one supporting means for securing the second rigid PCMCIA cover in position with respect to the PCMCIA board assembly.

5. The card defined in claim 4 wherein the first cover includes at least one support structure for securing the first cover in position with respect to the board assembly.

6. The card defined in claim 4 wherein the second cover includes at least one support structure for securing the second cover in position with respect to the board assembly.

7. The card defined in claim 5 or 6 wherein said at least one support structure comprises a rib.

8. The card defined in claim 4 wherein the first cover and the second cover comprise molded plastic.

9. The card defined in claim 4 wherein the first cover and the second cover comprise glass filled polycarbonate.

10. The card defined in claim 4 wherein the first cover includes a seam ultrasonically bonded to a second seam integrated into the second cover.

11. A method of manufacturing a card architecture comprising the steps of:

aligning welding points on first and second rigid covers having integrated portions of a frame, wherein the welding points comprise a plurality of energy directors and corresponding receptor holes where the energy directors have a pointed region and width slightly less than that of the corresponding receptor hales and the receptor holes have a solid bottom;

mating the plurality of energy directors and the corresponding receptor holes to encompass a board assembly having a plurality of electronic devices and an interface to transfer signals to and from plurality of electronic devices, such that the pointed region contacts the solid bottom; and ultrasonically bonding the first and second rigid covers at contact points between the plurality of energy directors and the corresponding receptor holes by directing ultrasonic waves only at each energy director and receptor hole pair, such that the pointed regions of energy directors bond into and with bottoms of corresponding receptor holes to form a rigidized frame around the board assembly.

12. The method defined in claim 11 wherein the step of ultrasonically bonding comprises selecting amplitude of the ultrasonic waves and tuning the ultrasonic waves so as to prevent damage to components on the circuit board.

13. The method defined in claim 11 wherein thickness and location of the energy directors contribute to avoid damage to components on the board assembly within the card architecture.

14. The method defined in claim 11 wherein the board assembly comprises at least one oscillator and at least one SAW filter, and further wherein the thickness and location of the energy directors contribute to avoid damage to said at least one oscillator and said at least one SAW filter.

15. The method defined in claim 11 wherein the first rigid cover includes at least one wall, and said step of ultrasonically bonding comprises selecting amplitude of the ultrasonic waves and tuning the ultrasonic waves so as to prevent damage to said at least one wall.

16. The method defined in claim 15 wherein the wall has a thickness of approximately 0.009 inches.

17. The method defined in claim 11 wherein at least one of the plurality of welding points comprises a seam and the step of ultrasonically bonding comprises applying ultrasonic waves to the seam to form an ultrasonic bond.

18. A method of manufacturing a PCMCIA card comprising the steps of:

aligning welding points on first and second rigid PCMCIA covers having integrated portions of a frame, wherein the welding points comprise a plurality of energy directors and corresponding receptor holes where the energy directors have a pointed region and width slightly less than that of the corresponding receptor holes and the receptor holes have a solid bottom;

mating the plurality of energy directors and the corresponding receptor holes to encompass a PCMCIA board assembly having a plurality of electronic devices and an interface to transfer signals to and from plurality of electronic devices, such that the pointed region contacts the solid bottom; and ultrasonically bonding the first and second rigid PCMCIA covers at contact points between the plurality of energy directors and the corresponding receptor holes by directing ultrasonic waves only at each energy director and receptor hole pair, such that the pointed regions of energy directors bond into and with bottoms of corresponding receptor holes to form a rigidized frame around the board assembly that adheres to the PCMCIA standard.

19. The method defined in claim 18 wherein the step of ultrasonically bonding comprises selecting amplitude of the ultrasonic waves and tuning the ultrasonic waves so as to prevent damage to components on the circuit board.

20. The method defined in claim 18 wherein thickness and location of the energy directors contribute to avoid damage to components on the board assembly within the card architecture.

21. The method defined in claim 18 wherein the board assembly comprises at least one oscillator and at least one SAW filter, and further wherein the thickness and location of the energy directors contribute to avoid damage to said at least one oscillator and said at least one SAW filter.

22. The method defined in claim 18 wherein the first rigid cover includes at least one wall, and said step of ultrasonically bonding comprises selecting amplitude of the ultrasonic waves and tuning the ultrasonic waves so as to prevent damage to said at least one wall.

23. The method defined in claim 22 wherein the wall has a thickness of approximately 0.009 inches.

24. The method defined in claim 18 wherein at least one of the plurality of welding points comprises a seam and the step of ultrasonically bonding comprises applying ultrasonic waves to the seam to form an ultrasonic bond.

* * * * *